(12) United States Patent
Trumbo

(10) Patent No.: US 7,209,066 B1
(45) Date of Patent: Apr. 24, 2007

(54) CIRCUIT AND METHOD FOR EXTENDING MICROCONTROLLER ANALOG INPUT CAPABILITY

(75) Inventor: Dale A. Trumbo, Tucson, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/253,479

(22) Filed: Oct. 18, 2005

(51) Int. Cl.
   *H03M 1/00* (2006.01)
(52) U.S. Cl. .................. 341/155; 341/141
(58) Field of Classification Search ........... 341/172, 341/154, 144, 161, 155, 153, 163, 141
See application file for complete search history.

(56) References Cited

U.S. PATENT DOCUMENTS

| | | | |
|---|---|---|---|
| 4,308,598 A | 12/1981 | Mahmood | |
| 4,451,891 A | 5/1984 | Baba | |
| 4,630,207 A | 12/1986 | Baba | |
| 4,654,632 A | 3/1987 | Yoshida et al. | |
| 4,901,275 A | 2/1990 | Hardie et al. | |
| 4,918,647 A | 4/1990 | Downey | |
| 5,072,375 A | 12/1991 | Takeuchi et al. | |
| 5,168,276 A * | 12/1992 | Huston et al. | 341/141 |
| 5,404,356 A | 4/1995 | Abe | |
| 5,600,845 A | 2/1997 | Gilson | |
| 5,651,113 A | 7/1997 | Lin et al. | |
| 5,771,394 A | 6/1998 | Asghar et al. | |
| 6,029,007 A | 2/2000 | Baba | |
| 6,078,972 A | 6/2000 | Takai | |
| 6,346,908 B1 * | 2/2002 | Jones, III | 341/172 |
| 6,480,913 B1 | 11/2002 | Monteiro | |
| 6,675,284 B1 | 1/2004 | Warren | |

* cited by examiner

*Primary Examiner*—Brian Young
(74) *Attorney, Agent, or Firm*—Ingrassia Fisher & Lorenz

(57) ABSTRACT

A circuit and method extends the analog input capability of a microcontroller by including an autonomous sequence control circuit that supplies input signal setting data and implements delay functions independent of the microcontroller central processing unit (CPU). The sequence controller supplies input signal selection commands to an input multiplexer, and analog signal processing commands to one or more analog signal processing circuits. After a predetermined settling time, the sequence control circuit then initiates an analog-to-digital converter (ADC) to convert the select analog signal to digital data. The circuit and method extend the number of available external address bits and the maximum settling time of the ADC.

16 Claims, 2 Drawing Sheets

CIRCUIT AND METHOD FOR EXTENDING MICROCONTROLLER ANALOG INPUT CAPABILITY

TECHNICAL FIELD

The present invention relates to microcontroller analog-to-digital (A/D) signal conversion and control and, more particularly, to a circuit and method for extending the analog input capability of microcontroller A/D converters (ADCs).

BACKGROUND

Microcontrollers are used in myriad devices and systems to implement one or more control and/or monitoring schemes. For example, many aircraft engines are controlled via an engine controller, such as a digital electronic engine controller (DEEC) or a full authority digital engine controller (FADEC), that may be implemented using a plurality of microcontrollers. The microcontrollers may receive various command signals, and a plurality of signals representative of various physical and/or operational parameters and, implementing one or more control laws via an on-board central processing unit (CPU), control the overall operation of the aircraft engine to achieve the desired performance.

In many instances the physical and/or operational parameter signals supplied to the microcontrollers are analog signals, which may need to be converted to digital signals for further processing. Thus, many microcontrollers, such as those that are used in aircraft engine controllers, include one or more analog-to-digital converters (ADCs). The ADCs included in some microcontrollers are so-called "queued" ADCs (QADCs). A QADC includes a queue that is used to store various commands and to run the stored commands independent of the CPU.

The microcontrollers that are presently used in engine controllers and various other aircraft-related systems and devices, whether implemented with one or more QADCs or various other types of ADCs, are generally robust and generally operate reliably and safely. However, these devices do suffer certain drawbacks. In particular, the ADCs typically exhibit two performance limitations. These limitations include the number of available external address bits, and the maximum settling time to which the ADC can be set.

Hence, there is a need for a circuit and method that can extend the number of available external address bits and/or the maximum settling time of an ADC, preferably without relying on microcontroller CPU intervention. The present invention addresses at least this need.

BRIEF SUMMARY

The present invention provides a circuit and method that extends the analog input capability of a microcontroller. In one embodiment, and by way of example only, a circuit includes a multiplexer, an analog signal processing circuit, queued analog-to-digital converter (QADC), and a sequence control circuit. The multiplexer is adapted to receive a plurality of analog signals and an input select signal, and is operable, in response to the input select signal, to output one of the received analog signals. The analog signal processing circuit is coupled to receive the analog signal output from the multiplexer and is further coupled to receive a process command signal representative of one or more analog signal processing parameters. The analog signal processing circuit is operable, in response to the process command signal, to process the analog signal using the one or more analog signal processing parameters and supply a processed analog signal. The QADC is coupled to receive the processed analog signal and a conversion trigger signal, and is operable, upon receipt of the conversion trigger signal, to convert the processed analog signal to digital data representative thereof. The sequence control circuit is operable to supply the input select signal, the process command signal, and the conversion trigger signal.

In another exemplary embodiment, a controller circuit includes a multiplexer, an analog signal processing circuit, a queued analog to digital converter (QADC), a processor, and a sequence control circuit. The multiplexer is adapted to receive a plurality of analog signals and an input select signal, and is operable, in response to the input select signal, to output one of the received analog signals. The analog signal processing circuit is coupled to receive the analog signal output from the multiplexer and is further coupled to receive a process command signal representative of one or more analog signal processing parameters. The analog signal processing circuit is operable, in response to the process command signal, to process the analog signal using the one or more analog signal processing parameters and supply a processed analog signal. The QADC is coupled to receive the processed analog signal and a conversion trigger signal, and is operable, upon receipt of the conversion trigger signal, to convert the processed analog signal to digital data representative thereof. The processor is operable to supply a sequence control initiate command and is coupled to receive the digital data from the QADC. The processor is operable, upon receipt of the digital data, to process the digital data in accordance with a predetermined process. The sequence control circuit is coupled to receive the sequence control initiate command and is operable, upon receipt thereof, to supply the input select signal, the process command signal, and the conversion trigger signal.

In yet a further exemplary embodiment, a method of extending the analog input capability of a microcontroller includes supplying a plurality of independent analog signals, selecting one of the analog signals, and generating a process command signal representative of one or more analog signal processing parameters. The selected analog signal is in accordance with an analog signal processing function that implements the one or more analog signal processing parameters, thereby generating a processed analog signal. A conversion command is generated and, upon generation of the conversion command, the processed analog signal is converted to digital data representative thereof.

Other independent features and advantages of the preferred circuit, microcontroller, and method will become apparent from the following detailed description, taken in conjunction with the accompanying drawings which illustrate, by way of example, the principles of the invention.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
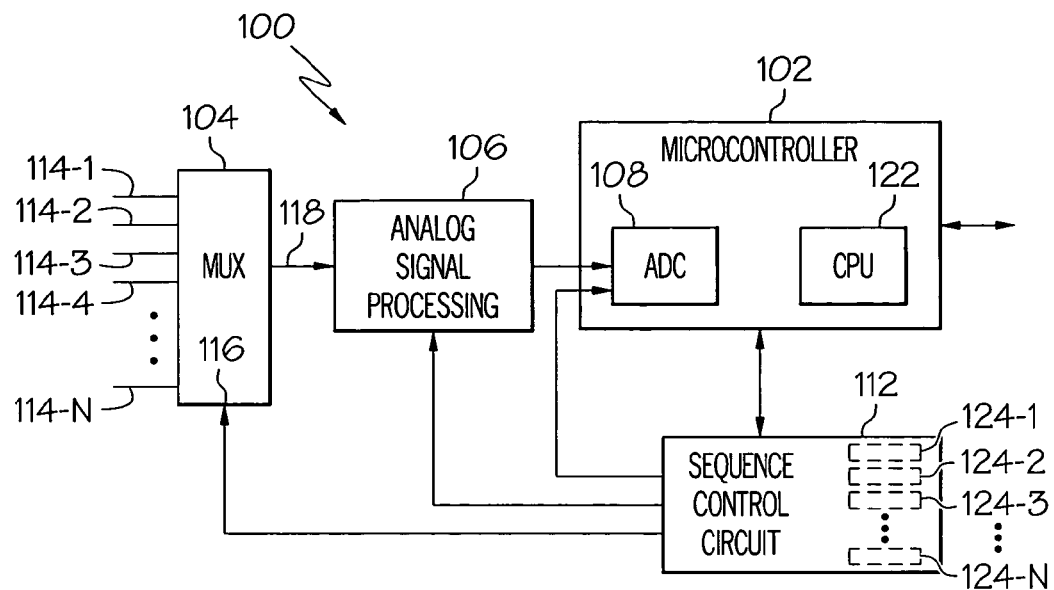
FIG. 1 is a block diagram of an exemplary embodiment of a circuit that may extend the analog input capability of a microcontroller.

Turning now to FIG. 1, a circuit 100 that extends the analog input capability of a microcontroller 102 is depicted. The depicted circuit 100 includes a multiplexer 104, an analog signal processing circuit 106, an analog-to-digital converter (ADC) 108, and a sequence control circuit 112. The multiplexer 104 includes a plurality of analog inputs 114 (114-1, 114-2, 114-3, 114-4, . . . 114-N), one or more input select terminals 116 (for clarity, only one depicted) and an output terminal 118. The inputs 114 are each adapted to receive an analog signal such as, for example, a temperature signal, a pressure signal, or a flow signal, just to name a few. The input select terminal 116 receives an input select signal from the sequence control circuit 112 that is representative of a specific one of the multiplexer inputs 114. In response to the input select signal, the multiplexer 104 outputs, via the output terminal 118, the analog signal supplied to the selected multiplexer input 114.

It will be appreciated that the multiplexer 104 may be implemented using any one of numerous types of multiplexers now known or developed in the future for multiplexing multiple signals to one or more devices. It will additionally be appreciated that the circuit 100 may be implemented with more than one multiplexer 104, if needed or desired, thereby allow more analog signals to be processed. No matter the particular physical implementation or number of multiplexers 104, the analog signal that is output from the multiplexer 104 is supplied to the analog signal processing circuit 106.

The analog signal processing circuit 106 is coupled to the multiplexer 104 and the sequence control circuit 112. More specifically, the analog signal processing circuit 106 is coupled to the multiplexer output terminal 118, and thus receives the analog signal that is output from multiplexer 104. The analog signal processing circuit 106 additionally receives a process command signal from the sequence control circuit 112. The process command signal supplied from the sequence control circuit 112 includes data and/or information representative of one or more analog signal processing parameters. The analog signal processing circuit 106 is configured to be responsive to the process command signal, and to process the analog signal that is output from the multiplexer 104 using the analog signal processing parameters.

It will be appreciated that the analog signal processing circuit 106 may vary, and may be implemented using any one of numerous known analog signal processing circuits that are configured to respond to a process command signal. For example, the analog signal processing circuit 106 may be implemented as a variable gain amplifier, a variable frequency filter circuit, or both, just to name a few. Moreover, the process command signal that is supplied to the analog signal processing circuit 106 may vary depending, for example, on the analog signal processing parameter that is being controlled. For instance, the gain, offset, or slope of an amplifier may controlled, the filter frequency setpoint may be controlled, or any one or more of numerous other analog signal processing parameters may be controlled. In any case, the analog signal processing circuit 106 supplies a processed analog signal to the ADC 108.

The ADC 108 is coupled to receive the processed analog signal from the analog signal processing circuit 106 and a conversion trigger signal from the sequence control circuit 112. The ADC 108, upon receipt of the conversion trigger signal, and using any one of numerous conventionally known techniques, converts the processed analog signal to digital data. The digital data may then be supplied, via one or more additional circuit elements and/or communications buses, to a central processing unit (CPU) 122 for additional processing. The ADC 108 is preferably implemented as part of the microcontroller 102, and is preferably configured as a queued ADC, to thereby conduct a sequence of analog to digital conversions without intervention by the CPU 122. It will be appreciated, however, that this is merely exemplary and that the ADC 108 could be implemented physically separate from the microcontroller 102.

The sequence control circuit 112, as was noted above, supplies the input select signal to the multiplexer 104, the process command signal to the analog signal processing circuit 106, and the conversion trigger signal to the ADC 108. As FIG. 1 additionally depicts, the sequence control circuit 112 is coupled to the microcontroller 102, and receives an initiate command therefrom. The sequence control circuit 112 is preferably configured such that, upon receipt of the initiate command, it supplies the input select signal, the process command signal, and the conversion trigger signal to the multiplexer 104, the analog signal processing circuit 106, and the ADC 108, respectively, without further intervention from the microcontroller CPU 122.

Although the sequence control circuit 112 may be configured in any one of numerous ways to implement the above-described functionality, in the depicted embodiment the sequence control circuit 112 includes a plurality of registers 124 or "queues" that each store input signal setting data. The sequence control circuit 112 uses the input signal setting data to generate the input select signals that are supplied to the multiplexer 104, the process command signals that are supplied to the analog signal processing circuit 106, and the conversion trigger signals that are supplied to the ADC 108. The process command signals that are supplied to the analog signal processing circuit 106 may vary depending, for example, on the type of analog signal processing that the analog signal processing circuit 106 is implementing and on the particular analog signal that is being processed. Moreover, the amount of settling time that the analog signal processing circuit 106 may need before it supplies a sufficiently settled processed analog signal may vary depending, for example, on the specific analog signal processing that is being implemented by the analog signal processing circuit 106. It will thus be appreciated that the sequence control circuit 112 preferably stores input signal setting data for each of the multiplexer analog inputs 114 that is receiving an analog signal. These data include information representative of the input select signal, the associated process command signal, and a predetermined settling time. Hence, in the depicted embodiment, in which the multiplexer 104 include N-number of analog inputs 114-1, 114-2, 114-3, . . . 114-N, the sequence control circuit 112 includes at least N-number of registers 124-1, 124-2, 124-3, . . . 124-N, each having input signal setting data stored therein.

Having described the overall configuration of the circuit 100 and the various individual functions of each of the elements that comprise the circuit 100, a detailed description of the overall operation of the circuit 100, at least according to a particular embodiment, will now be described. In doing so, reference should be made to FIG. 2, which depicts the overall process 200 in flowchart form, in combination with FIG. 1, as needed or desired. It is noted that the parenthetical references in the following discussion correspond to the numerically referenced steps of the flowchart depicted in FIG. 2. It is additionally noted that some of the process steps are depicted and described as being implemented in a sequential order. However, it will be appreciated that this is done merely for ease of both description and illustration, and that various steps depicted in FIG. 2 and described alone may be implemented substantially simultaneously or in a different order than what is shown and described.

The process 200 begins (201) following, for example, a system or circuit reset or upon system or circuit power-up. In either case, after a suitable settling time following a reset or power-up operation, the process 200 implemented by the circuit 100 initially loads the channel setting data into the appropriate registers 124 in the sequence control circuit 112 (202). The sequence control circuit 112 is then initialized to retrieve the input signal setting data from the register 124-1 that is storing the input signal setting data associated with the multiplexer first analog input 114-1 (204).

Following initialization, the sequence control circuit 112 retrieves the input signal setting data from the appropriate register 124-1 and, using the retrieved data, generates and supplies the input select signal (206) and the process command signal (208). Upon receipt of the input select signal, the multiplexer 104 begins supplying the analog signal on the first analog input 114-1 to the analog signal processing circuit 106. The analog signal processing circuit 106, upon receipt of the process command signal and the analog signal, begins processing the analog signal using the analog signal processing parameters, as described above, and supplying the processed analog signal. However, until the predetermined settling time has lapsed (210), the ADC 108 does not begin sampling and converting the processed analog signal.

After the predetermined settling time has lapsed (210), the sequence control circuit 112 generates and supplies the conversion trigger signal (212) to the ADC 108. The ADC 108, upon receipt of the conversion trigger signal, begins sampling the processed analog signal, converting the signal to digital data, and storing the digital data in its queues. This signal flow and signal processing then continues until a predetermined sampling time period has lapsed (214), at which time the sequence control circuit 112 no longer supplies the conversion trigger signal (216). If the input signal setting data that was just retrieved was not retrieved from the N-th register 124-N, then the process (206–216) repeats using the input signal setting data retrieved from the next register 124. If, however, the data was retrieved from the N-th register 124-N (220), then the CPU 122 retrieves the digital data from the QADC queues (222), and the sequence control circuit 112 is initialized to retrieve the input signal setting data from the register 124-1 that is storing the input signal setting data associated with the multiplexer first analog input 114-1 (204). The process (206–216) then repeats until, for example, the circuit 100 is reset or de-energized.

Figure 3:
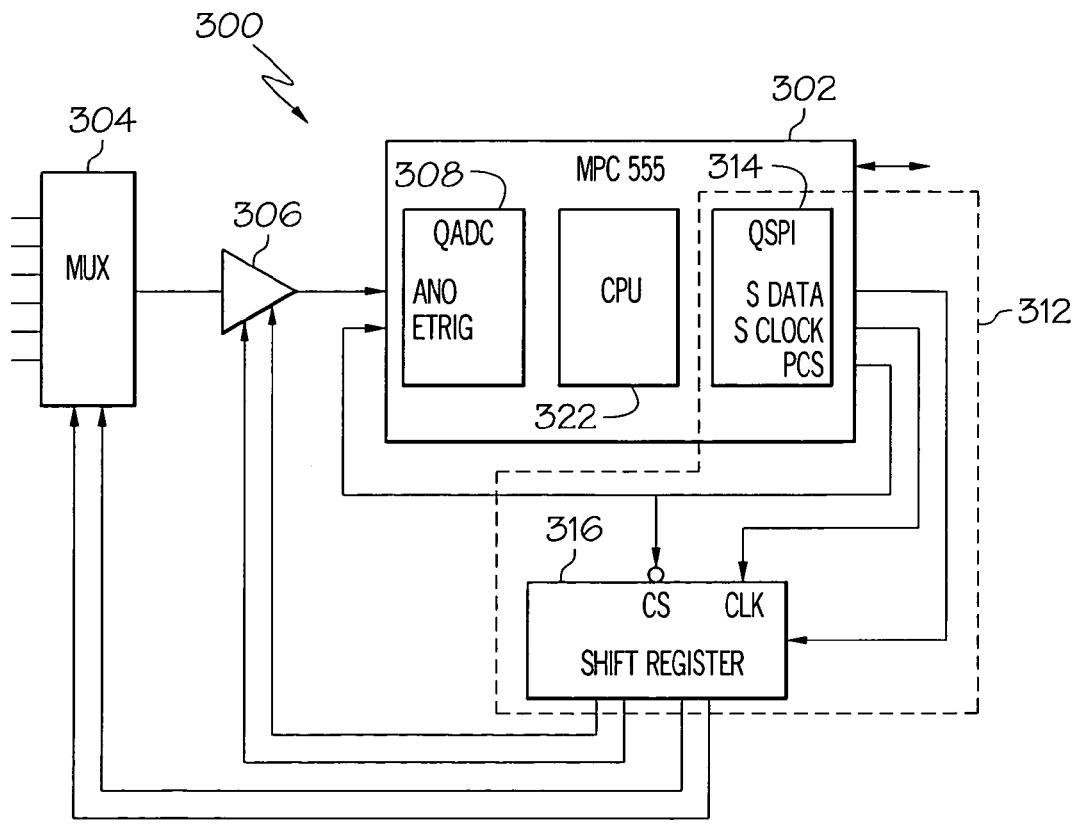
FIG. 3 is an block diagram of an exemplary physical implementation of the circuit depicted in FIG. 1.

It will be appreciated that the circuit 100 depicted in FIG. 1 and described above is merely exemplary, and that the circuit 100 may be implemented in any one of numerous configurations. With reference to FIG. 3, a particular embodiment is depicted and will now be described. The circuit 300, as in the previously described embodiment, includes a microcontroller 302, a multiplexer 304, an analog signal processing circuit 306, an ADC 308, and a sequence control circuit 312. However, the microcontroller 302 is implemented using an MPC 555 microcontroller, which includes an on-board queued ADC (QADC) 308 and an on-board queued serial peripheral interface (QSPI) 314. Thus, the on-board QADC 308 is used to implement the analog-to-digital signal conversion. The QSPI 314, as depicted in FIG. 3, and as will be described further below, is used to implement the sequence control circuit 312.

The multiplexer 304 functions similar to the multiplexer 104 previously described, and will thus not be further described. The analog signal processing circuit 306 also functions, in general, similar to the previously described analog signal processing circuit 106. In the depicted embodiment, however, the analog signal processing circuit 306 is specifically implemented as a variable gain amplifier. Thus, the process command signals supplied from the sequence control circuit 312 include parameters representative of an amplification gain factor.

The sequence control circuit 312 depicted in FIG. 3 implements the same basic functionality as that which is implemented by the sequence control circuit 112 of FIG. 1. However, the sequence control circuit 312 in FIG. 3 includes the previously mentioned QSPI 314 and a shift register 316. The QSPI 314, as is known, can store instructions and data in local registers or "queues" and, upon being initiated by an on-board CPU 322, runs the stored instructions independent of the CPU 322. In FIG. 3, the QSPI 314 supplies the conversion trigger signal to the QADC 308, via its PCS terminal or its SCLK terminal, and supplies data representative of the input select signal and the process command signal to the shift register 316. The shift register 316, upon being enabled (via its CS terminal) and clocked (via its CLK terminal) by the QSPI 314, in turn supplies the input select signal to the multiplexer 304 and the process command signal to the analog signal processing circuit 306.

The QADC 308 includes an ANO terminal and an ETRIG terminal, which are coupled to receive the processed analog signals from the analog signal processing circuit 306 and the conversion trigger signal from the QSPI 314, respectively. As with the previously described embodiment, the QADC 308, upon receipt of the conversion trigger signal, samples the processed analog signal and converts it into digital data. Moreover, the QADC 308, similar to the QSPI 314, stores instructions and converted digital data in local registers or "queues" and, upon being initiated by the CPU 322, runs the stored instructions independent of the CPU 322.

Figure 2:
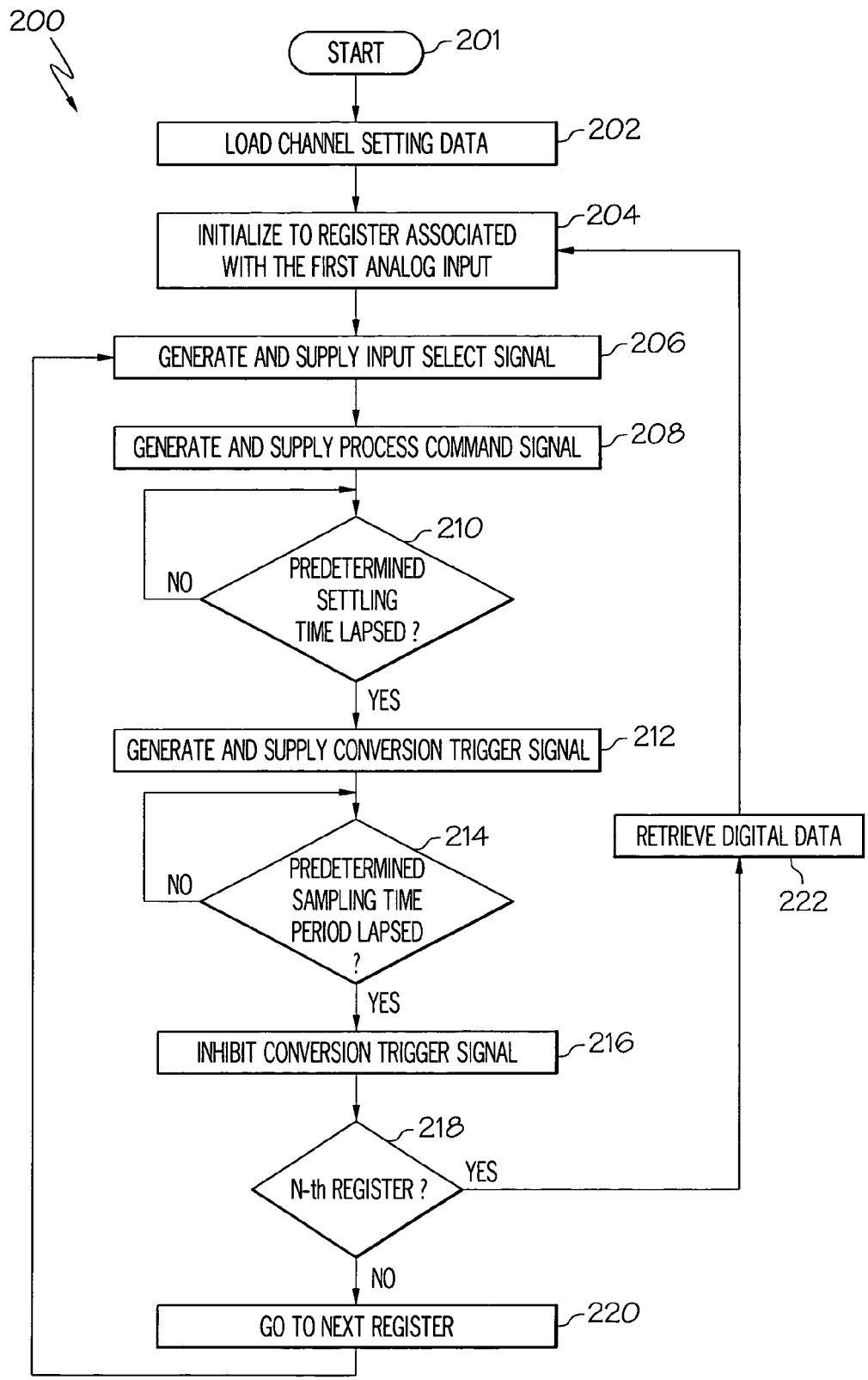
FIG. 2 is a flowchart depicting an exemplary process implemented by the circuit depicted in FIG. 1.

It is noted that the circuit 300 depicted in FIG. 3 implements the same general process 200 depicted in FIG. 2 and described above. As such its operation will not be further described.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. A circuit, comprising:
a multiplexer adapted to receive a plurality of analog signals and an input select signal, the multiplexer operable, in response to the input select signal, to output one of the received analog signals;
an analog signal processing circuit coupled to receive the analog signal output from the multiplexer and further coupled to receive a process command signal representative of one or more analog signal processing parameters, the analog signal processing circuit operable, in response to the process command signal, to process the analog signal using the one or more analog signal processing parameters and supply a processed analog signal;

a queued analog to digital converter (QADC) coupled to receive the processed analog signal and a conversion trigger signal, the QADC operable, upon receipt of the conversion trigger signal, to convert the processed analog signal to digital data representative thereof; and a sequence control circuit operable to supply the input select signal, and the process command signal, and is further operable to supply the conversion trigger signal a predetermined settling time period after supplying the process command signal.

2. The circuit of claim 1, further comprising:
a processor coupled to receive the digital data from the QADC and configured to process the digital data in accordance with a predetermined process.

3. The circuit of claim 2, wherein the QADC is configured to operate independent of the processor.

4. The circuit of claim 2, wherein the sequence control circuit is configured to operate independent of the processor.

5. The circuit of claim 1, wherein:
the analog processing circuit comprises a variable gain amplifier;
the one or more analog processing parameters include an amplification gain factor; and
the variable gain amplifier, in response to the process command signal, amplifies the analog signal at the amplification gain factor and supplies an amplified analog signal as the processed analog signal.

6. The circuit of claim 5, wherein the one or more analog signal processing parameters further includes a signal offset factor.

7. The circuit of claim 5, wherein the one or more analog signal processing parameters further includes a filter frequency setpoint.

8. The circuit of claim 1, wherein the sequence control circuit comprises:
a queued serial peripheral interface (QPSI) operable to supply the conversion trigger signal, data representative of the input select signal and the process command signal, and a clock signal; and
a shift register coupled to receive the clock signal and the data representative of the input select signal and the process command signal and operable, upon receipt thereof, to supply the input select signal and the process command signal.

9. The circuit of claim 8, wherein:
the processor is configured to supply a QPSI initiate command; and
the QPSI is configured, upon receipt of the QPSI initiate command, to run independent of the processor.

10. A controller circuit, comprising:
a multiplexer adapted to receive a plurality of analog signals and an input select signal, the multiplexer operable, in response to the input select signal, to output one of the received analog signals;
an analog signal processing circuit coupled to receive the analog signal output from the multiplexer and further coupled to receive a process command signal representative of one or more analog signal processing parameters, the analog signal processing circuit operable, in response to the process command signal, to process the analog signal using the one or more analog signal processing parameters and supply a processed analog signal;

an queued analog to digital converter (QADC) coupled to receive the processed analog signal and a conversion trigger signal, the QADC operable, upon receipt of the conversion trigger signal, to convert the processed analog signal to digital data representative thereof;

a processor operable to supply a sequence control initiate command and coupled to receive the digital data from the QADC, the processor operable, upon receipt of the digital data, to process the digital data in accordance with a predetermined process; and a sequence control circuit coupled to receive the sequence control initiate command and operable, upon receipt thereof, to supply the input select signal, and the process command signal, and is further operable to supply the conversion trigger signal a predetermined settling time period after supplying the process command signal.

11. The controller circuit of claim 10, wherein:
the analog processing circuit comprises a variable gain amplifier;
the one or more analog processing parameters include an amplification gain factor; and
the variable gain amplifier, in response to the process command signal, amplifies the analog signal at the amplification gain factor and supplies an amplified analog signal as the processed analog signal.

12. The controller circuit of claim 11, wherein the one or more analog signal processing parameters further includes a signal offset factor.

13. The controller circuit of claim 11, wherein the one or more analog signal processing parameters further includes a filter frequency setpoint.

14. The controller circuit of claim 10, wherein the sequence control circuit comprises:
a queued serial peripheral interface (QPSI) operable to supply the conversion trigger signal, data representative of the input select signal and the process command signal, and a clock signal; and
a shift register coupled to receive the clock signal and the data representative of the input select signal and the process command signal and operable, upon receipt thereof, to supply the input select signal and the process command signal.

15. A method of extending the analog input capability of a microcontroller, comprising the steps of:
supplying a plurality of analog signals;
selecting one of the analog signals;
generating a process command signal representative of one or more analog signal processing parameters;
processing the selected analog signal in accordance with an analog signal processing function that implements the one or more analog signal processing parameters, thereby generating a processed analog signal;
processing the selected analog signal for a predetermined settling time period and then generating a conversion command; and
upon generation of the conversion command, converting the processed analog signal to digital data representative thereof.

16. The method of claim 15, further comprising:
converting the processed analog signal to digital data for a predetermined sampling time period.

* * * * *